(12) United States Patent
McClure et al.

(10) Patent No.: US 8,827,165 B2
(45) Date of Patent: *Sep. 9, 2014

(54) TEST MODE CIRCUITRY FOR A PROGRAMMABLE TAMPER DETECTION CIRCUIT

(75) Inventors: David C. McClure, Carrollton, TX (US); Sooping Saw, The Colony, TX (US); Robert Wadsworth, Flower Mound, TX (US)

(73) Assignee: STMicroelectronics, Inc., Coppell, TX (US)

( * ) Notice: Subject to any disclaimer, the term of this patent is extended or adjusted under 35 U.S.C. 154(b) by 819 days.

This patent is subject to a terminal disclaimer.

(21) Appl. No.: 13/039,832

(22) Filed: Mar. 3, 2011

(65) Prior Publication Data

US 2011/0148620 A1    Jun. 23, 2011

Related U.S. Application Data

(63) Continuation of application No. 11/473,451, filed on Jun. 23, 2006, now Pat. No. 7,978,095.

(60) Provisional application No. 60/739,150, filed on Nov. 22, 2005.

(51) Int. Cl.
    *G06K 19/06*    (2006.01)
    *G11C 16/22*    (2006.01)
    *G11C 16/20*    (2006.01)
    *G11C 17/16*    (2006.01)

(52) U.S. Cl.
    CPC ............... *G11C 16/20* (2013.01); *G11C 16/22* (2013.01); *G11C 17/16* (2013.01)
    USPC ..................... 235/492; 340/870.02

(58) Field of Classification Search
    USPC .................... 235/492; 340/870.02, 10.4, 10.5
    See application file for complete search history.

(56) References Cited

U.S. PATENT DOCUMENTS

| | | | |
|---|---|---|---|
| 4,034,366 A | 7/1977 | Memishian, Jr. | |
| 4,468,652 A | 8/1984 | Wang et al. | |

(Continued)

FOREIGN PATENT DOCUMENTS

EP    1081477 A1    3/2001

OTHER PUBLICATIONS

European Search Report and Opinion for EP 06255930.7 dated Mar. 5, 2007 (5 pages).

*Primary Examiner* — Ahshik Kim
(74) *Attorney, Agent, or Firm* — Gardere Wynne Sewell LLP

(57) ABSTRACT

An integrated circuit includes an output pad, an alarm output pad, and a test mode output pad. A first multi-bit register is programmable to store programmable data such as data that identifies a customer for whom the integrated circuit has been manufactured. A second multi-bit register is programmable to store customer specified threshold data. A first circuit selectively couples the first and second multi-bit registers to the output pad. The first circuit is operable responsive to the integrated circuit being placed into a test mode to perform parallel-to-serial conversion of either the customer identification data stored in the first multi-bit register or the customer specified threshold data stored in the second multi-bit register and drive the converted data for output through the output pad. The integrated circuit further includes a tamper detection circuit operable responsive to the customer specified threshold data to generate a tamper alarm signal. A second circuit selectively couples the tamper alarm signal to the alarm output pad and test mode output pad depending on whether the integrated circuit is in a test mode. More specifically, the second circuit operates to drive the alarm output pad with the tamper alarm signal when the integrated circuit is not in test mode and drive the test mode output pad with the tamper alarm signal when the integrated circuit is in test mode (with the alarm output pad driven to a known state).

20 Claims, 6 Drawing Sheets

(56) References Cited

U.S. PATENT DOCUMENTS

| | | |
|---|---|---|
| 5,185,717 A | 2/1993 | Mori |
| 5,239,664 A | 8/1993 | Verrier et al. |
| 5,394,019 A | 2/1995 | Audy |
| 5,394,078 A | 2/1995 | Brokaw |
| 5,535,168 A | 7/1996 | Yepez, III et al. |
| 5,854,635 A | 12/1998 | Wakamatsu |
| 5,898,368 A * | 4/1999 | Handley et al. ............ 340/514 |
| 6,217,213 B1 | 4/2001 | Curry et al. |
| 6,288,638 B1 | 9/2001 | Tanguay et al. |
| 6,489,831 B1 | 12/2002 | Matranga et al. |
| 6,593,850 B1 | 7/2003 | Addy |
| 6,750,683 B2 | 6/2004 | McClure et al. |
| 7,042,380 B2 | 5/2006 | Iacob et al. |
| 7,290,190 B2 | 10/2007 | Obara |
| 7,978,095 B2 * | 7/2011 | McClure et al. ......... 340/870.02 |
| 2002/0021590 A1 | 2/2002 | Lammers et al. |
| 2003/0118079 A1 | 6/2003 | Marinet et al. |

* cited by examiner

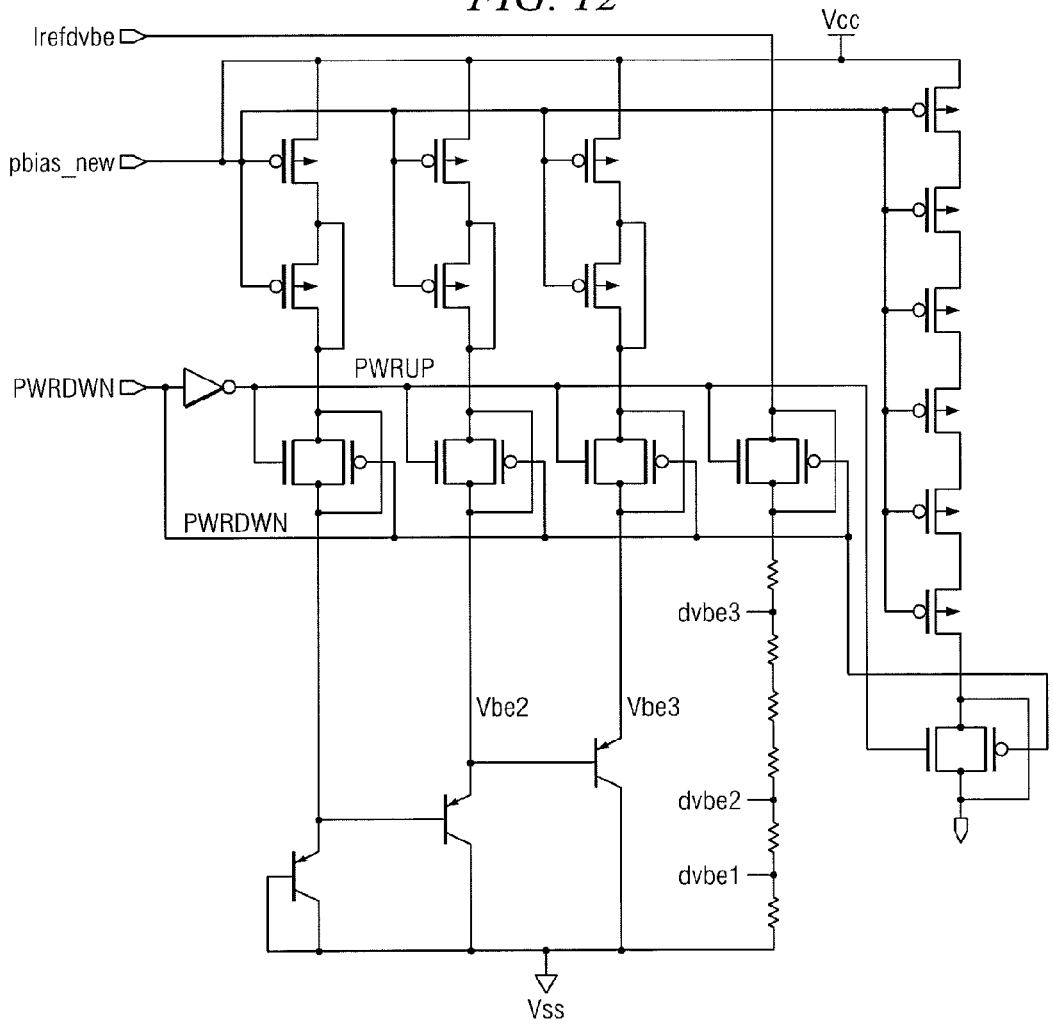

TEST MODE CIRCUITRY FOR A PROGRAMMABLE TAMPER DETECTION CIRCUIT

PRIORITY CLAIM

This application is a continuation of U.S. application Ser. No. 11/473,451 filed Jun. 23, 2006, which claims the benefit of U.S. Provisional Application Ser. No. 60/739,150, filed Nov. 22, 2005, the disclosures of which are hereby incorporated by reference.

BACKGROUND OF THE INVENTION

1. Technical Field of the Invention

The present invention relates to test mode circuitry, and more particularly to test mode circuitry useful in connection with a programmable tamper detection alarm circuit.

2. Description of Related Art

There exist electronics systems in which very sensitive data may be stored in an integrated circuit (IC). For example, some portable credit card scanners store credit card data in volatile memory which, if pilfered, would potentially expose credit card holders to credit card fraud.

In an effort to prevent such pilfering of data, techniques exist for detecting when an IC or system is being tampered with, and destroying the stored data in response to the detection. In this way, sensitive data stored in such systems remains inaccessible.

It is also known to custom program an integrated circuit for a given customer. In connection with a tamper detection integrated circuit, the programmed threshold voltage(s) which would trigger an alarm from the circuit could differ among the customers for that integrated circuit. If the custom programming for one customer differs from that of another customer, it is critical that the produced integrated circuits for the two customers do not get mixed up with other. There is accordingly a need for a mechanism to test a programmed integrated circuit to ensure it belongs to a given customer.

It is also known in the art with respect to tampering of integrated circuits for the tamperer to enter the test mode of the integrated circuit in order to try and access information or circuit outputs. A need accordingly exists for circuitry that would impede a tamperer's access to stored information or certain circuit outputs when the integrated circuit is placed in test mode.

SUMMARY OF THE INVENTION

In accordance with an embodiment of the invention, an integrated circuit comprises an output pad, a first multi-bit register which is programmable to store data that identifies a customer for whom the integrated circuit has been manufactured, and first circuitry coupling the first multi-bit register to the output pad, the first circuitry operable responsive to the integrated circuit being placed into a test mode to perform parallel-to-serial conversion of the customer identification data stored in the first multi-bit register and drive the serial customer identification data for output through the output pad.

In accordance with an embodiment, an integrated circuit comprises a tamper detection circuit operable to generate a tamper alarm signal, an alarm output pad, a test mode output pad, and first circuitry selectively coupling the tamper alarm signal to the alarm output pad and test mode output pad depending on whether the integrated circuit is in a test mode, the first circuitry operating to drive the alarm output pad with the tamper alarm signal when the integrated circuit is not in test mode and drive the test mode output pad with the tamper alarm signal when the integrated circuit is in test mode.

In accordance with another embodiment, an integrated circuit comprises an output pad, an alarm output pad and a test mode output pad. A first multi-bit register is programmable to store data that identifies a customer for whom the integrated circuit has been manufactured, and a second multi-bit register is programmable to store customer specified threshold data. A first circuit selectively couples the first and second multi-bit registers to the output pad, the first circuit being operable responsive to the integrated circuit being placed into a test mode to perform parallel-to-serial conversion of either the customer identification data stored in the first multi-bit register or the customer specified threshold data stored in the second multi-bit register and drive the converted data for output through the output pad. A tamper detection circuit is operable responsive to the customer specified threshold data to generate a tamper alarm signal. A second circuit selectively couples the tamper alarm signal to the alarm output pad and test mode output pad, the second circuit being operable to drive the alarm output pad with the tamper alarm signal when the integrated circuit is not in test mode and drive the test mode output pad with the tamper alarm signal when the integrated circuit is in test mode.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 12 shows a circuit diagram for a possible implementation of a signal generator circuit for the temperature tampering detection circuit.

DETAILED DESCRIPTION OF THE DRAWINGS

Figure 1:
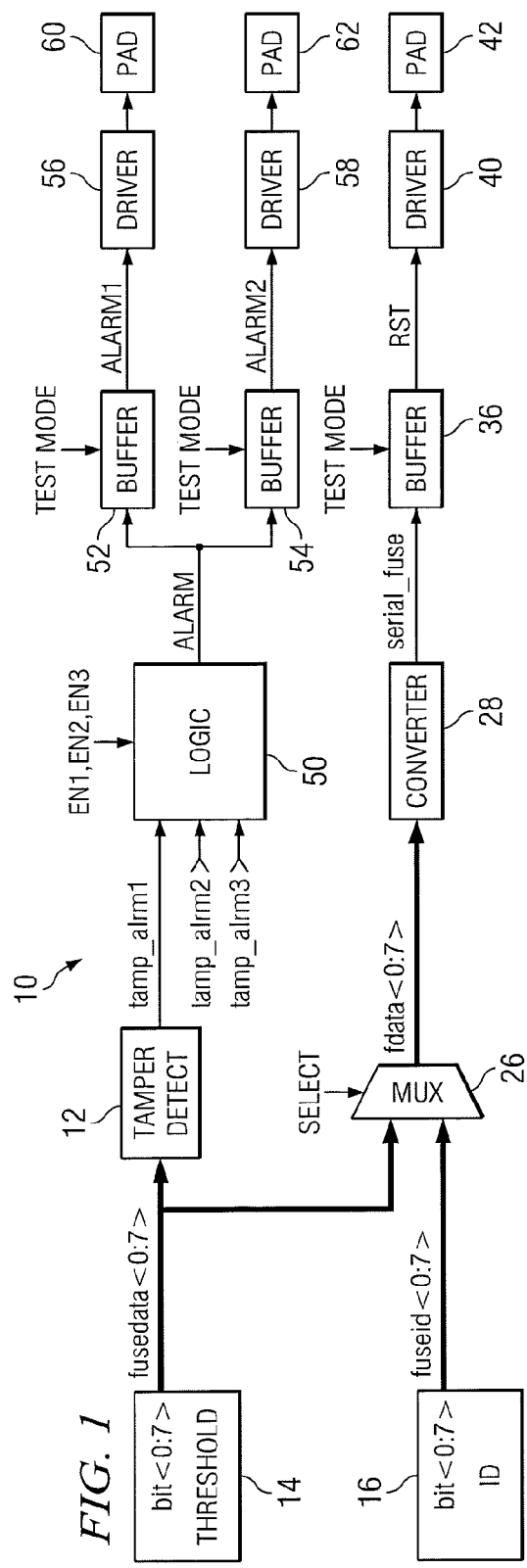
FIG. 1 is a block diagram of a circuit in accordance with an embodiment of the invention.

Reference is now made to FIG. 1 wherein there is shown a block diagram of a circuit in accordance with an embodiment of the invention. An integrated circuit 10 includes a tamper detection circuit 12 which generates an output alarm signal tamp_alrm1 whenever the circuit 12 detects a tamper event. The circuit could comprise a temperature tamper detection circuit like that disclosed in U.S. Provisional Application Ser.

Figure 10:
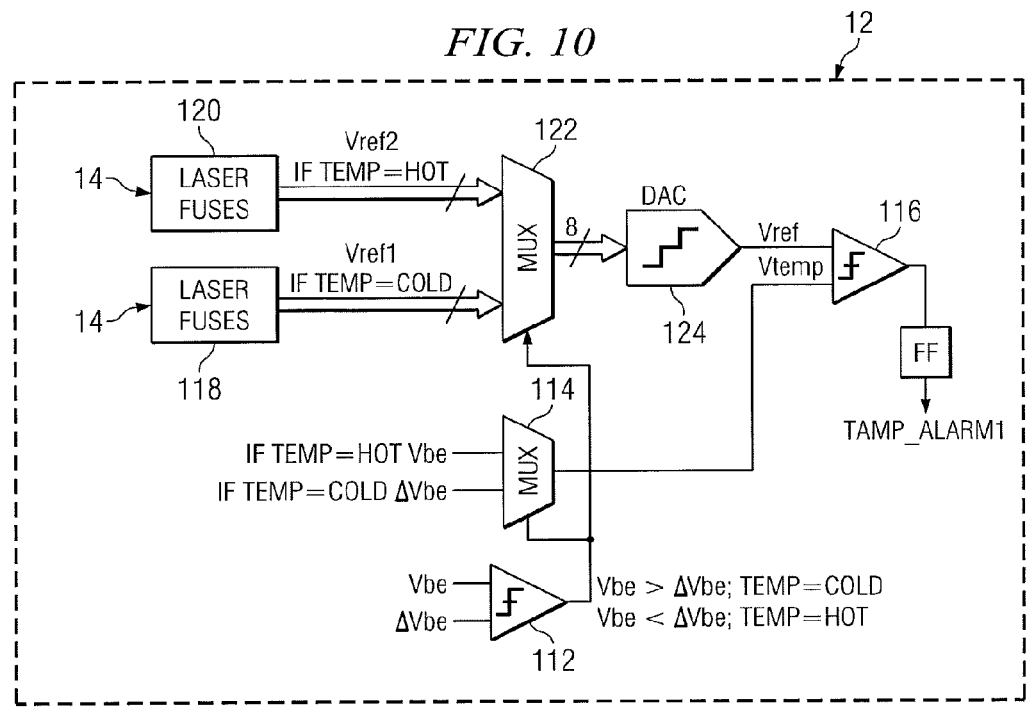
FIG. 10 is a block diagram of a temperature tampering detection circuit.

No. 60/739,150, filed Nov. 22, 2005, and shown in FIG. 10. Alternatively, the circuit 12 could comprise any one or more of other tamper detection circuits known in the art.

The integrated circuit 10 is custom programmed for each purchasing customer. In this regard, the circuit 10 may include certain threshold programming which is provided with respect to the operation of the tamper detection circuit 12. For example, in the case where the tamper detection circuit 12 is a temperature tamper detection circuit, as mentioned above, that threshold programming may comprise programming of the threshold temperature(s) at which a tampering event is to be detected. One or more registers 14 may be included to store the threshold temperature(s) as reference voltages. Such registers 14 may be configured as fuse-type devices wherein the threshold is programmed as a digital value by selectively blowing certain ones of the fuses. The output of the registers 14 is a multibit digital data signal fusedata<0:7> which is applied to the tamper detection circuit 12.

Additionally, the circuit 10 may include certain programming which is provided with respect to the circuit 10 itself. For example, in the case of custom provided integrated circuits 10, the certain programming may comprise programming of a customer identification into the circuit which is unique to the customer for whom the integrated circuit is being provided. One or more registers 16 may be included to store the programmed customer identification. Such registers 16 may be configured as fuse-type devices wherein the customer identification is programmed as a digital value by selectively blowing certain ones of the fuses. The output of the registers 16 is a multibit digital data signal fuseid<0:7>.

Figure 2:
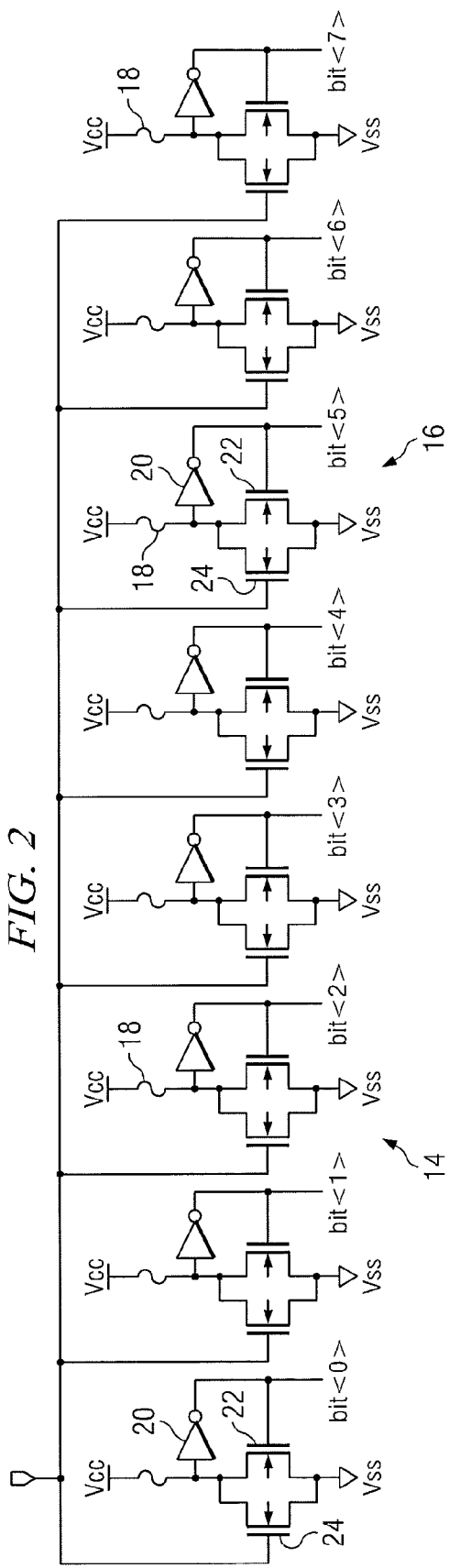
FIG. 2 is a circuit diagram of a register for storing programmable digital information.

Reference is now made to FIG. 2 wherein there is shown a circuit diagram of a register 14 or 16 for storing programmable digital information such as thresholds and identifications. The register 14/16 includes a number of fuse elements 18 which together form a fuse register. At each fuse 18 location, a combination of an inverter 20 and transistor 22 forms a latch which operates to latch a single bit of the register value which is indicated by the state of the fuse 18. A transistor 24 associated with each fuse location is gated by a pulse signal that, when going high, ensures that the drains of transistors 22/24, and thus the input of inverter 20, is set at a logic low value if the fuse element 18 has been blown. The output of the fuse register 14/16 is a multibit digital signal bit<0:7> taken at the outputs of the inverters 20. In this case, bit<0:7> can represent either fusedata<0:7> or fuseid<0:7> depending on whether the circuit is used for register 14 or register 16, respectively.

With reference once again to FIG. 1, the circuit 10 further includes a multi-bit multiplexer 26 receiving at a first multibit input port the fusedata<0:7> output from the register 14 and receiving at a second multibit input port the fuseid<0:7> output from the register 16. Responsive to a SELECT signal received at a control input of the multiplexer 26, one of the received fusedata<0:7> output or received fuseid<0:7> output is output from the multiplexer 26 as the multibit fdata<0:7> output.

Figure 3:
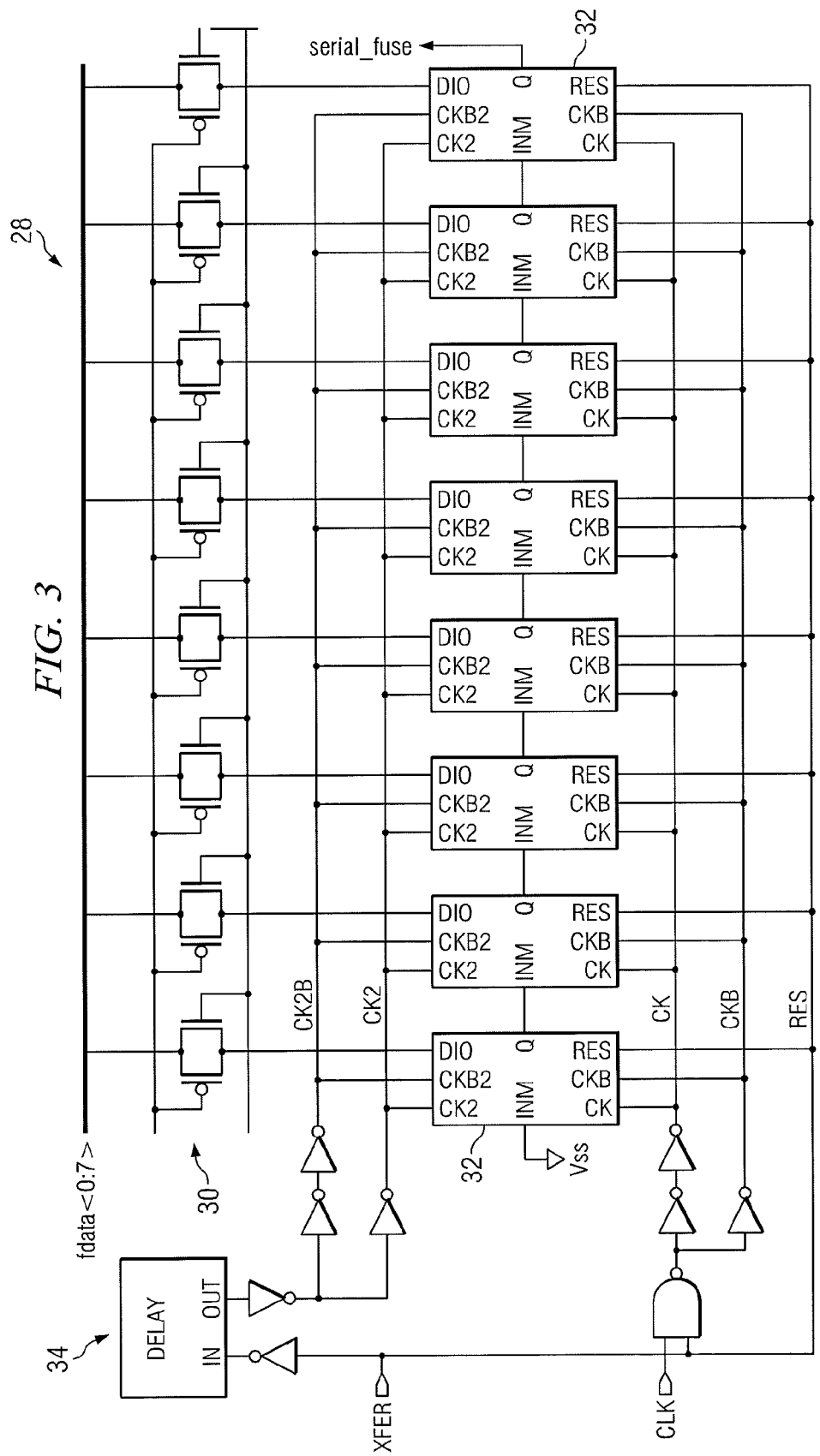
FIG. 3 is a circuit diagram of a parallel-to-serial data converter circuit.
Figure 4:
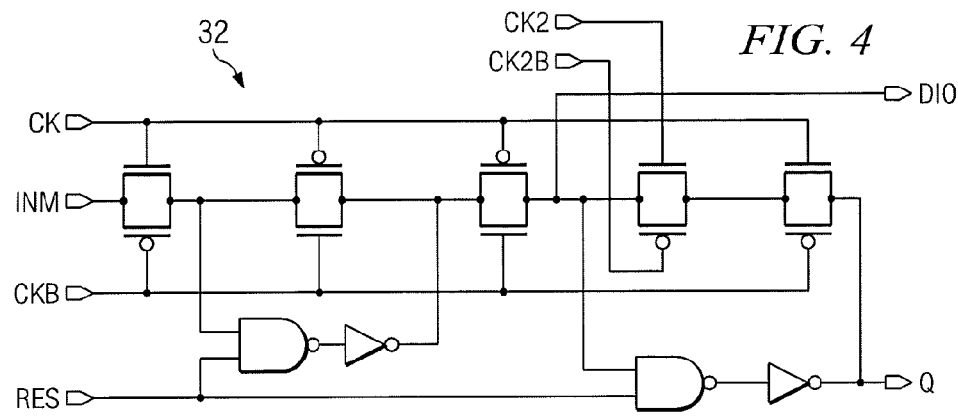
FIG. 4 is a circuit diagram of a flip-flop circuit within the parallel-to-serial data converter circuit.

The multibit fdata<0:7> output from the multiplexer 26 is received at the input of a parallel-to-serial data converter circuit 28. The data converter circuit 28 receives the multibit fdata<0:7> in parallel format, loads the fdata<0:7> into a multibit register and reads the loaded data out from the multibit register in serial format as the signal serial_fuse. Reference is now made to FIG. 3 wherein there is shown a circuit diagram of the parallel-to-serial data converter circuit 28. The parallel received fdata<0:7> is passed through a set of pass transistors 30 gated by complementary control signals and applied to the DIO input of a corresponding set of flip-flop circuits 32. Each flip-flop circuit 32 (see, FIG. 4) includes an input INM and an output Q. The output Q of one flip-flop circuit 32 is connected to the input INM of the next flip-flop circuit 32 in the set. The output Q of a last flip-flop circuit 32 generates the output signal serial_fuse. Responsive to signals generated by a logical clocking and reset circuit 34, the set of flip-flop circuits 32 function to take the parallel received fdata<0:7> and read the individual bits thereof out in serial fashion as the serial_fuse signal. A transfer signal XFER and clock signal CLK drive operation of the clocking and reset circuit 34 to generate the signals CK2B, CK2, CK, CKB and RES which are applied to and control operation of the set of flip-flop circuits 32 to latch the received parallel bits of the fdata<0:7> signals and then serially clock out those bits in the serial_fuse signal.

Figure 5:
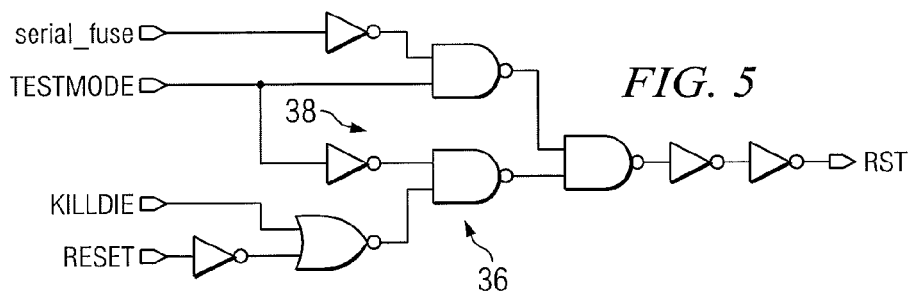
FIG. 5 is a circuit diagram of a buffer circuit.

With reference once again to FIG. 1, the serial_fuse signal containing the serially read out fdata<0:7> signals is applied to the input of a buffer circuit 36 (see, FIG. 5). The buffer circuit 36 further receives a control signal TESTMODE. Responsive to the TESTMODE signal being active (i.e., the integrated circuit 10 is configured for test mode operation), the logic 38 of the buffer circuit 36 functions to pass the received serial_fuse signal to an output as the signal RST. If the control signal TESTMODE is, on the other hand, inactive, then the logic 38 of the buffer circuit 36 drives the signal RST to a known logic state and blocks passage of the received serial_fuse signal. Similarly, responsive to a RESET and KILLDIE signal, the logic 38 of the buffer circuit 36 drives the signal RST to a known logic state and blocks passage of the received serial_fuse signal. More specifically, the KILLDIE signal is controlled by a fuse circuit (not shown). Responsive to the fuse of that fuse circuit being blown, the KILLDIE signal goes to logic high and blocks the RST output from being able to be asserted to logic low (even if the TESTMODE signal is active).

FIG. 1 further shows that the RST output of the buffer circuit 36 is applied to the input of a driver circuit 40. The driver circuit 40 can have any known driver configuration suitable for driving a signal to an output pad 42 of the integrated circuit 10. Thus, the driver circuit 40 functions to drive the output pad 42 with the RST output (i.e., with the serial_fuse signal which is the serially read out fdata<0:7> signals from the SELECT signal selected registers 14 and 16).

With the foregoing circuitry, the integrated circuit 10 supports a test mode operation of the integrated circuit 10 wherein testing personnel can select one of the registers 14 and 16 (using the signal SELECT), and have the programmed data contained therein, whether it is threshold data or customer identification data, serially read out from the integrated circuit through the output pad 42 (when TESTMODE is active). In this way, the testing personnel can confirm that the fuses 18 of the registers 14 and 16 have been properly blown during programming of the integrated circuit. More specifically, the testing personnel can have the programmed threshold data read out from register 14 in order to confirm that the custom programmed integrated circuit 10 has been programmed correctly. Additionally, the testing personnel can have the programmed customer identification data read out from register 16 in order to confirm that the custom programmed integrated circuit 10 belongs to a certain customer and further confirm that the threshold programming specified by that certain customer has been properly programmed into the register 16.

Thus, the integrated circuit 10 may include test circuitry comprising programmable circuitry which can be programmed by the manufacturer to identify the customer for the particular integrated circuit. In an implementation, the programmable circuitry may include a plurality of programmable elements, such as selectively blowable fuses. The programmed customer identification information as well as the programmed threshold information for the tamper detection operation may be serially shifted to an output pad 42 of the integrated circuit during a package test mode of operation. Specifically, during the package test mode operation, the programmed customer identification information and the programmed threshold information may be stored in the registers 14 and 16 and subsequently serially shifted from those registers to an output pad 42 of the integrated circuit. This particular package test mode operation may, for example, be entered into by applying a supervoltage (i.e., a voltage higher than the Vcc voltage of the integrated circuit) to an input pad of the integrated circuit in a manner known to those skilled in the art.

Figure 6:
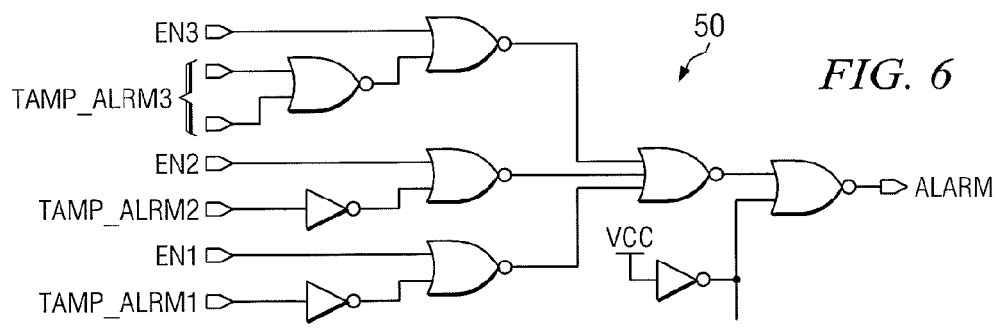
FIG. 6 is a circuit diagram of a circuit for logically combining alarm signals.

Reference is once again made to FIG. 1 wherein the tamper detect circuit 12 functions to detect a tamper event and generate in response thereto a tamper alarm signal tamp_alrm1. Other tamper detection circuits (not shown) may be provided for the integrated circuit 10 to test for and detect other types of tamper events. An example might be a tamper detection circuit operable to detect voltage altering. Other tamper detection circuits are known to those skilled in the art. In any event, these other tamper detection circuits would produce corresponding tamper alarm signals such as tamp_alrm2 and tamp_alrm3 which are indicative of the detection of a tamper event. The tamper alarm signals are received at the inputs of a logic circuit 50 (see FIG. 6) which functions to selectively logically combine the plural tamper alarm signals and generate a single alarm signal indicative of detection of a tamper event with respect to the integrated circuit 10. Selective combination of the plural tamper alarm signals is effectuated in response to corresponding enable signals EN1, EN2 and EN3. In the event an enable signal is logic high, the tamper alarm signal corresponding thereto (i.e., tamp_alrm1 corresponds with EN1), is disabled. In other words, the logic state of that particular tamper alarm signal does not affect the state of the output alarm signal. In this way, the alarm indicative output of one or more of the tamper detection circuits included within the integrated circuit can be controllably ignored.

The alarm signal output from the logic circuit 50 is provided to the inputs of two alarm buffer circuits 52 and 54. The first alarm buffer circuit 52 outputs a first alarm signal alarm1 for application to a corresponding pad driver circuit 56. The pad driver circuit 56 can have any known driver configuration suitable for driving a signal to a corresponding first alarm output pad 60 of the integrated circuit 10. Thus, the driver circuit 56 functions to drive the output pad 60 with the alarm1 output. The second alarm buffer circuit 54 outputs a second alarm signal alarm2 for application to a corresponding pad driver circuit 58. The pad driver circuit 58 can have any known driver configuration suitable for driving a signal to a corresponding second alarm output pad 62 of the integrated circuit 10. Thus, the driver circuit 58 functions to drive the output pad 62 with the alarm2 output.

Figure 7:
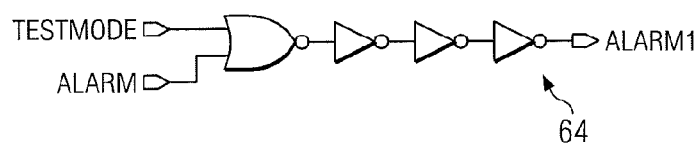
FIG. 7 is a circuit diagram of a logic circuit for an alarm buffer.

The first alarm buffer circuit 52 further receives the test mode control signal TESTMODE. With reference to FIG. 7, logic circuitry 64 functions to selectively control whether the output signal alarm1 follows the received alarm signal input. If TESTMODE is not active (i.e., the integrated circuit is NOT operating in test mode), then the state of the output signal alarm1 is governed by the state of the received alarm signal input. Thus, in a normal operating mode (not a test mode), the alarm1 signal follows the alarm signal, and the alarm signal is generated and output by first driver 56 to first pad 60. Conversely, if TESTMODE is active (i.e., the integrated circuit is operating in test mode), then the logic circuit 64 of the first buffer 52 forces the output signal alarm1 to a known and fixed logic state. Thus, when the integrated circuit is configured in the test mode, alarm signal output to the first pad 60 is disabled thus preventing a tamperer from gaining access to the alarm output during test mode at that first pad 60.

Figure 8:
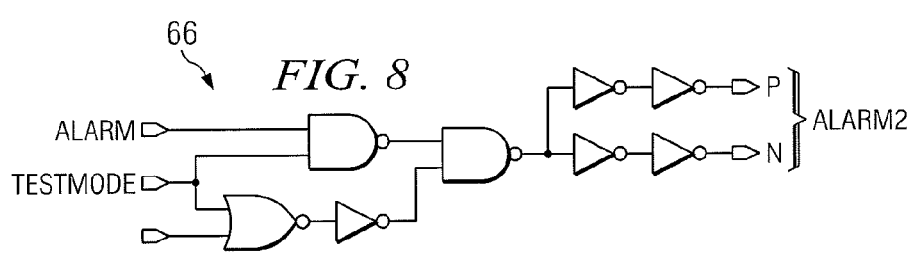
FIG. 8 is a circuit diagram of a logic circuit for an alarm buffer.

The second alarm buffer circuit 54 also further receives the test mode control signal TESTMODE. With reference to FIG. 8, logic circuitry 66 functions to selectively control whether the output signal alarm2 follows the received alarm signal input. If TESTMODE is active (i.e., the integrated circuit is operating in test mode), then the state of the output signal alarm2 is governed by the state of the received alarm signal input. Thus, in a test mode, the alarm2 signal follows the alarm signal, and the alarm signal is generated and output by second driver 58 to second pad 62. Conversely, if TESTMODE is not active (i.e., the integrated circuit is NOT operating in test mode), then the logic circuit 66 of the second buffer 54 forces the output signal alarm2 to a known and fixed logic state. Thus, when the integrated circuit is configured in the test mode, alarm signal output to the second pad 62 is enabled thus allowing those with knowledge of the re-mapping of the alarm signal during test mode to gain access to the alarm output during test mode at that second pad 62.

With reference to FIG. 8, it will be noted that the alarm2 signal is provided to differentially drive the input of driver 58. A similar circuit could be used for the alarm1 signal in FIG. 7. Alternatively, each of alarm1 and alarm2 may be generated in the manner shown in FIG. 7.

Thus, because of the potential for a tamperer to undesirably enter the package test mode of operation, the integrated circuit 10 includes circuitry for shifting information, such as alarm information, from a first output pad (pad 60) and corresponding package pin to a second output pad (pad 62) and corresponding package pin. Specifically, in the normal mode of operation of the integrated circuit 10, the alarm signal (alarm), which is formed from the logical combination of tamp_alrmx signals output from a plurality of tamper detection circuits (including circuit 12), is mapped and/or connected to the first output pad 60 and corresponding package pin. When the integrated circuit 10 enters into the package test mode of operation, however, the alarm signal is remapped to be connected to the second output pad 62 and corresponding package pin. During the package test mode of operation, the first output pad 60 and corresponding package pin may be disabled—continuously driven to a particular logic state and/or voltage level. When the IC re-enters the normal mode of operation from the package test mode of operation, the alarm signal is remapped again to be connected to the first output pad 60 and corresponding package pin. By remapping alarm and/or other signals when in the package test mode of operation, integrated circuit 10 may be more fully tested after packaging while better ensuring that a tamperer is less likely to effectively use the IC in the package test mode.

One type of tamper detection involves detecting whether the temperature of the integrated circuit 10 falls outside (too high or too low) an expected operating range, and asserting an alarm responsive to such detection. Temperature detection serves to prevent a tamperer from accessing stored, sensitive data in part by the tamperer changing the operating temperature of the integrated circuit 10.

It is recognized that a substantially linear relationship exists between temperature and the change in the base-emitter voltage of a bipolar transistor (hereinafter "delta Vbe") within the IC or system to be protected. Specifically, delta Vbe is substantially process insensitive and can be used for temperature sensing due to its superior linearity. To achieve good voltage/temperature sensitivity, the delta Vbe voltage needs to be amplified from its typical voltage variation over normal temperature conditions.

One difficulty encountered with monitoring delta Vbe over the entire operating temperature range is that the variation of amplified delta Vbe may not always be within the operating temperature range of the Vcc voltage supply to the IC or system. For example, with delta Vbe sensitivity of 6 mv/degree C., the Vbe voltage may vary from −1.2v at −45 degrees C. to 2.4v at 120 degrees C. Taking into consideration processing variations, this 1.2v delta Vbe variation between low and high temperature fails to fit within some relatively small Vcc operating ranges for the integrated circuit 10 which may have a minimum Vcc voltage level of 1.2v.

Figure 9:
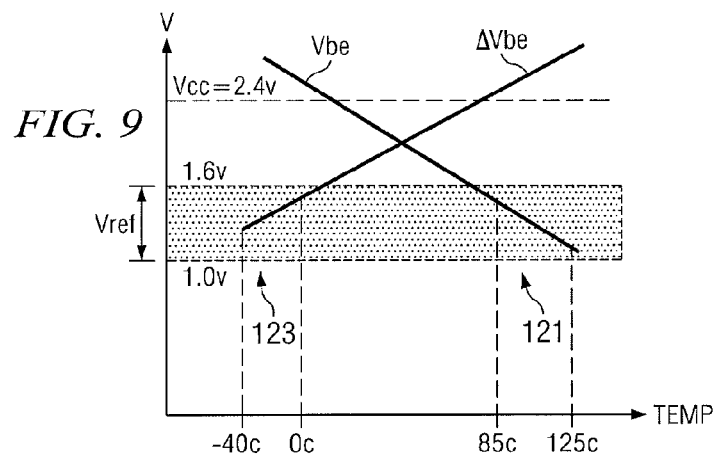
FIG. 9 is a graph illustrating Vbe and delta Vbe over an exemplary temperature range.

In an effort to ensure that temperature is accurately sensed over the entire operating temperature range of the integrated circuit, the tamper detection circuit 12 not only monitors delta Vbe but also Vbe. Specifically, Vbe, the base-emitter voltage of a bipolar transistor within the integrated circuit 10, also varies substantially linearly with temperature. Whereas delta Vbe varies in direct proportion to changes in temperature, Vbe varies in indirect proportion to temperature. A graph comparing Vbe and delta Vbe over an exemplary operational temperature range for the integrated circuit is shown in FIG. 9.

In order to monitor temperature over an entire operating temperature range, such as −40 degrees C. to 125 degrees C., the temperature tamper detection circuit 12 monitors delta Vbe at relatively low temperatures and Vbe at elevated, or relatively high, temperatures. Specifically, delta Vbe is monitored at relatively low temperatures to determine whether the temperature falls below a first temperature (first threshold), and Vbe is monitored at relatively high temperatures to determine whether the temperature rises above a second temperature (second threshold). Because delta Vbe is less than a Vcc supply voltage level at relatively lower temperatures and Vbe is less than the Vcc supply voltage level at relatively higher temperatures, delta Vbe and Vbe may be monitored in this way by relatively easily comparing each to one or more reference voltages, such as a selected stable reference voltage Vref (see, FIG. 1) that, for example, is based upon a bandgap voltage. By comparing delta Vbe with the selected reference voltage Vref when the integrated circuit 10 is exposed to a lower or relatively low temperature and by comparing Vbe with the selected reference voltage Vref when the integrated circuit 10 is exposed to a higher or relatively high temperature, the temperature tamper detect circuit 12 is capable of detecting tampering which is trying to be made by altering the temperature. Advantageously, the circuit 12 is suitable for operation to make too low and/or too high temperature detections even when the integrated circuit 10 is being operated at relatively low Vcc supply voltage levels (for example, 1.2v or 1.8v, and see FIG. 9 at lower than 2.4v).

FIG. 10 is a block diagram of the temperature tampering detection circuit 12 which includes a first comparator 112 which compares delta Vbe with Vbe and generates an output signal that is used to determine whether delta Vbe or Vbe is to be compared to a reference voltage Vref. The comparison of delta Vbe with Vbe enables the circuit 12 to determine whether the Integrated circuit 10 is currently experiencing a relatively low or relatively high temperature environment (see, FIG. 9 which illustrates the relationship between delta Vbe and Vbe over a range of temperatures, where temperatures less than the temperature at the intersection point being relatively low, while temperatures more than the temperature at the intersection point being relatively high). As will be discussed later in more detail, the comparison of one of delta Vbe or Vbe to the reference voltage Vref is being made in order to determine whether a temperature "out of range" condition exists for the integrated circuit (i.e., whether the integrated circuit is experiencing either a too cold or too hot environment in comparison to corresponding temperature thresholds). Comparator 112 may include hysteresis in order to avoid the output of comparator 112 from undesirably oscillating during the comparison operation.

The circuit 12 further includes multiplexer circuitry 114 having data inputs coupled to receive delta Vbe and Vbe signals and a select input coupled to the output of comparator 112. Based on the select input state (corresponding to relatively low/cold or relatively high/hot), one of the delta Vbe and Vbe signals is selected by multiplexer circuitry 114 for output from the multiplexer circuitry 114. More specifically, if the select input state corresponds to relatively low/cold, then multiplexer selects the delta Vbe signal at the data input since FIG. 9 shows that this signal is better used for making the too cold determination. Alternatively, if the select input state corresponds to relatively high/hot, then multiplexer selects the Vbe signal at the data input since FIG. 9 shows that this signal is better used for making the too hot determination.

The circuit 12 further includes a comparator 116 having its data inputs coupled to receive both a first reference voltage Vref and the selected output of multiplexer circuitry 114 (either delta Vbe or Vbe). Comparator 112, which determines whether delta Vbe or Vbe is to be utilized in determining whether an "out of range" temperature exists, thus is used to provide the appropriate delta Vbe or Vbe signal to comparator 116 through controlling the selection operation of the multiplexer circuit 114. The output of comparator 116 changes state based on the result of the comparison operation. Thus, if in relatively low mode, comparator 116 changes state when Vbe is less than a selected vref as this would be indicative of a too cold condition (see, reference 123 in FIG. 9). Conversely, if in relatively high mode, comparator 16 changes state when delta Vbe is less than a selected vref as this would be indicative of a too hot condition (see, reference 121 in FIG. 9).

The output from the comparator 116 may be an alarm signal tamp_alarm1 (possibly buffered in a flip-flop FF). The alarm signal, when asserted, may cause the integrated circuit 10 to take measures to prevent sensitive data from being copied. For example, the alarm signal may cause the integrated circuit 10 to act on the stored, sensitive data by taking actions to erase and/or corrupt the stored data. The comparator 116 may have hysteresis in order to avoid the output of comparator 116 from undesirably oscillating during the comparison operation.

In order to monitor delta Vbe at low temperatures and Vbe at elevated temperatures, in one embodiment of the invention two voltage references Vref are utilized: one voltage reference Vref1 for use in determining whether the temperature falls below a predetermined low temperature (for the comparator 116 operation in determining whether delta Vbe is less than the voltage threshold), and a second voltage reference Vref2 for use in determining whether the temperature rises above a predetermined high temperature (for the comparator 116 operation in determining whether Vbe is less than the voltage threshold). With reference to FIG. 10, the circuit 12 further includes a first signal generator circuit 118 which generates a digital signal corresponding to first voltage reference Vref1, and a second signal generator circuit 120 which generates a digital signal corresponding to second voltage reference Vref2.

It will be understood, with reference to FIG. 9, that only a single vref value is needed as that specified vref could be used by the comparator 16 for purposes of making either of the temperature too low or temperature too high determinations. In such a case, only a single signal generator circuit 118/120 would be needed.

However, in a situation where a single voltage reference vref would not intersect the delta Vbe and Vbe lines at appropriate low and high temperature locations, respectfully, of interest, it would be preferred to use two voltage references Vref selectively chosen for the comparison operation based on whether the integrated circuit 10 was relatively cold or relatively hot.

First signal generator circuit 118 and second signal generator circuit 120 may each include programmable circuitry for setting and/or programming the digital signals corresponding to reference voltages Vref. Such programmability allows for the digital signals representing the reference voltages to be programmed to customer requirements. In a preferred implementation, the first and second signal generator circuits 118 and 120 are fuse register based circuits 14 as shown in FIG. 2 wherein the included fuses 18 are selectively blown (for example, by laser) to set a digital value in circuits 118, 120 which corresponds to a certain voltage reference for use in the comparison operation performed by comparator 116. Alternatively, first and second code generator circuits 118, 120 may include programmable floating gate transistors, or other programmed or programmable components which achieve the same operation.

Multiplexer circuitry 122 receives at data inputs thereof the outputs of signal generator circuits 118 and 120, i.e., the digital values corresponding to a first reference voltage Vref1 and a second reference voltage Vref2. Multiplexer circuitry 122 receives at a control and/or select input thereof the output of comparator 112. This output, representative of whether a relatively low temperature condition or relatively high temperature condition exists, is applied as a selection signal to multiplexer circuitry 122 so as to selectively place at the output of multiplexer circuitry 122 a digital signal from circuit 18 corresponding to reference voltage Vref1 (if delta Vbe is to be measured and compared at the relatively low temperatures), or a digital signal from circuit 120 corresponding to reference voltage Vref2 (if Vbe is to be measured and compared at relatively high temperatures).

The circuit 12 further includes a digital-to-analog converter circuit 124 which receives the digital output of multiplexer circuit 122 and generates an analog voltage level Vref corresponding thereto. Converter circuit 124 may, for example, utilize a resistor voltage divider having switches, controlled by the digital output of the multiplexer circuit 122, which serve as taps along the resistor voltage divider. In this way, an analog voltage signal may be generated corresponding to the digital signal generated by the multiplexer circuit 122 and provided to converter circuit 124.

As shown in FIG. 10, the output of converter circuit 124 is the analog reference voltage signal Vref which is applied to a second input of comparator 116. Again, this the analog reference voltage signal Vref may comprise reference voltage Vref1 (if delta Vbe is to be measured and compared at relatively low temperatures), or reference voltage Vref2 (if Vbe is to be measured and compared at relatively high temperatures). The comparator 116 functions to compare the analog reference voltage signal Vref to the output of multiplexer circuit 114 (delta Vbe or Vbe). When the voltage output of multiplexer circuit 114 (delta Vbe or Vbe) falls below the analog reference voltage signal Vref (Vref1 or Vref2), the comparator 116 output changes state thus indicating that the temperature environment of the integrated circuit 10 is extreme (too cold or too hot, respectively).

The operation of temperature tamper detection circuit 12 will now be described. Initially, the output of comparator 112 identifies whether delta Vbe is to be compared to reference voltage Vref1 in order to determine if the temperature of the integrated circuit 10 falls below a predetermined low temperature, or whether Vbe is to be compared to reference voltage Vref2 to determine if the temperature of the integrated circuit 10 rises above a predetermined high temperature. This identification is reached by comparing delta Vbe to Vbe. If delta Vbe is greater than Vbe, a relatively higher temperature exists indicating that Vbe should be compared to reference voltage Vref2. See, FIG. 9 at reference 121. In this scenario, the output of comparator 112 is in a first logic state indicative of a relatively high temperature environment. Alternatively, if Vbe is greater than delta Vbe, a relatively lower temperature exists indicating that delta Vbe should be compared to reference voltage Vref1. See, FIG. 9 at reference 123. In this scenario, the output of comparator 112 is in a second logic state indicative of a relatively low temperature environment.

Next, multiplexer circuit 114 provides at its output a signal delta Vbe or Vbe, depending upon the logic state of the output of comparator 112. In other words, if a relatively low temperature condition exists (i.e., the output of comparator 112 is in the second logic state) and delta Vbe is to be compared with reference voltage Vref1, the delta Vbe signal is provided by multiplexer circuit 114 to comparator 116. If, on the other hand, a relatively high temperature condition exists (the output of comparator 112 is in the first logic state) and Vbe is to be compared with reference voltage Vref2, the Vbe signal is provided by multiplexer circuit 114 to comparator 116.

Further, multiplexer circuit 122 provides at its output either the digital signal corresponding to reference voltage Vref1 or the digital signal corresponding to reference voltage Vref2, based upon the logic state of the output of comparator 112. If the relatively low temperature condition exists and delta Vbe is to be compared with reference voltage Vref1, the digital signal corresponding to reference voltage Vref1 is provided by multiplexer circuit 122 to converter circuit 124. On the other hand, if the relatively high temperature condition exists and Vbe is to be compared with reference voltage Vref2, the digital signal corresponding to reference voltage Vref2 is provided by multiplexer circuit 122 to converter circuit 124. Converter circuit 124 converts the digital signal provided by multiplexer circuit 124 into an analog signal. The analog output of converter circuit 124 is analog reference signal Vref which is provided to comparator 116.

As a result, the analog signal Vref is a first analog voltage Vref1 to be compared with signal delta Vbe at relatively lower temperatures, and a second analog voltage Vref2 to be compared with signal Vbe at relatively higher temperatures. With signal generator circuits 118 and 120 providing output signals that are programmable, these first and second analog voltages may be defined according to customer requirements.

Comparator 116 compares analog signal Vref with the selected one of delta Vbe and Vbe signals. The output of comparator 116, perhaps buffered by the flip flop FF, is used to signal whether an out-of-range (too high or too low) temperature exists and has been detected. Such a signal could be indicative of tampering with the integrated circuit 10. An integrated circuit 10 may, for example, use the output of comparator 116 to selectively take appropriate measures to protect or destroy the sensitive data stored in the system. The output of comparator 116 may be temporarily stored in the flip flop FF, the output of which is used to generate temperature detection alarm signal tamp_alrm1.

As explained above, the circuit 12 may be used to detect whether the integrated circuit 10 is operating below a predetermined low temperature threshold and/or above a predetermined high temperature threshold. Voltage references Vref1 and Vref2, which correspond to the predetermined low and high temperature thresholds, respectively, may be programmed in order to allow for the predetermined low and high temperature thresholds to be defined according to system or customer requirements. This programming may occur by operating the integrated circuit 10 in a test mode when subjected to the predetermined low and/or high temperature environment so as to determine the appropriate fuses to blow for generating voltage references Vref1 and Vref2.

Figure 11:
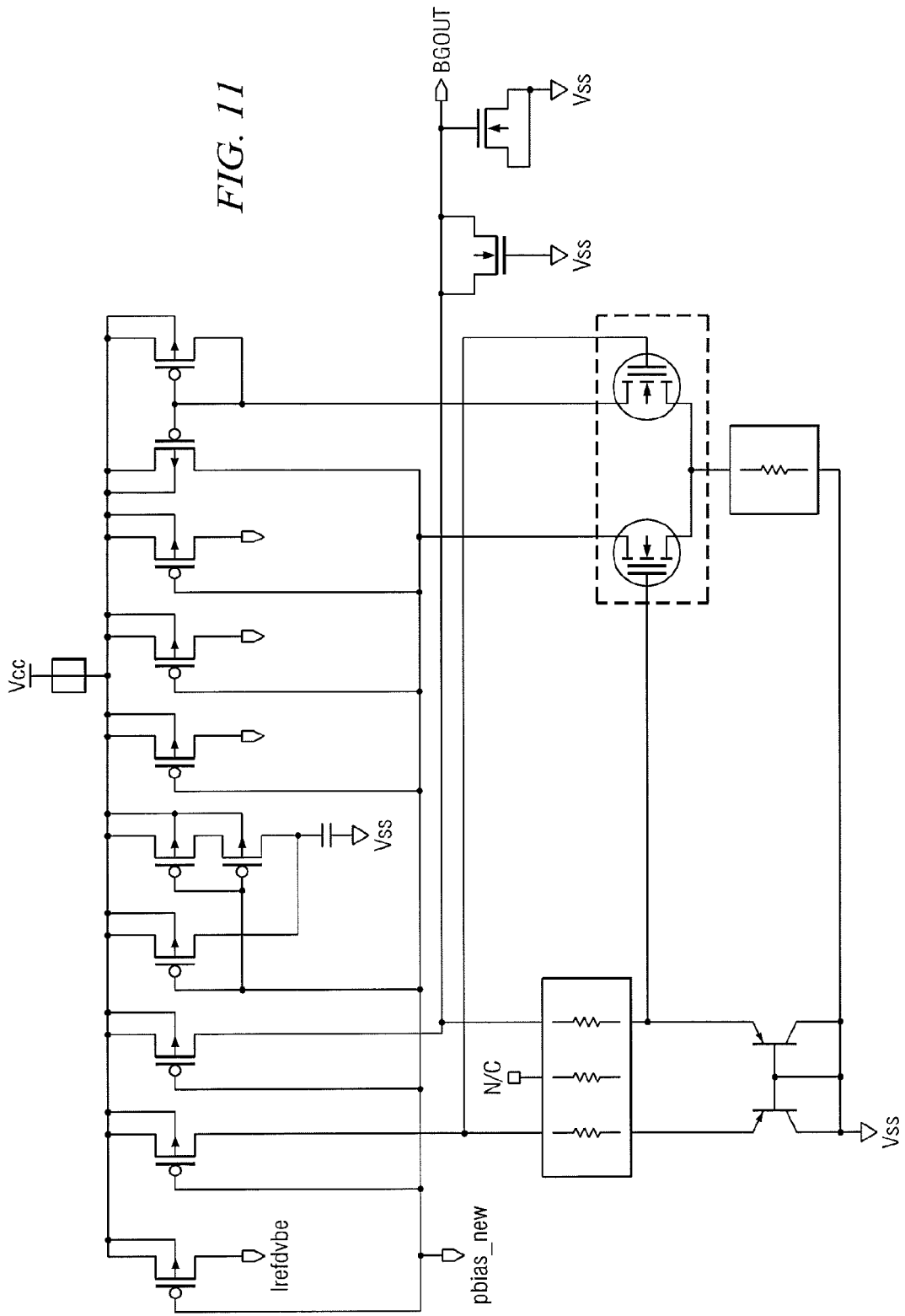
FIG. 11 shows a circuit diagram for a possible implementation of a bandgap voltage generator for the temperature tampering detection circuit.

FIG. 11 shows a circuit diagram for a possible implementation of a bandgap voltage generator. This circuit generates a reference current irefdvbe, a bias signal pbias_new and a bandgap output bgout. The circuit of FIG. 11 may further include a startup circuit in a manner known to those skilled in the art.

FIG. 12 shows a circuit diagram for a possible implementation of a signal generator circuit which includes one or more bipolar transistors possessing base-emitter junctions useful for measuring and monitoring Vbe and delta Vbe. The signal generator circuit receives the bandgap reference current Irefdvbe and bias signal pbias_new and operates to generate signals delta Vbe and Vbe. This circuit generates a 3 Vbe signal and dVbe signal. Three PNP transistor are stacked to form a 3 Vbe signal which has temperature coefficient of about −6 mv/c. Each PNP transistor is biased by pmos current source transistors with gate signal pbias_new. The DVBE3 signal is generated by feeding a PTAT (Proportional To Absolute Temperature, "Irefdvbe") current into a resistor. The resulting DVBE3 voltage is thus also PTAT. The DVBE3 Temperature coefficient is about +6 mv/c. A PWRDWN signal is used to power down this circuit, by disconnecting the current source transistors. When PWRDWN goes HIGH, the transmission gate is shut off and disconnect the biasing current. It will be noted that Irefdvbe is generated in the bandgap (see, FIG. 3K), wherein a voltage across a resistor is developed which is the difference of two VBE voltages based on different current densities. The current density can be based on different sized emitters and different values of currents going through each bipolar transistor.

Thus, Vbe is measured by passing a current through the bipolar transistor. A voltage divider circuit includes a tap from which delta Vbe may be obtained. Output signals vbe2 and dvbe2 in FIG. 12 are input to comparator 112 in FIG. 10 as the signals vbe and delta vbe, respectively. The output signals vbe3 and dvbe3 in FIG. 12 are indirectly coupled to comparator 116 of FIG. 10.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit including a plurality of integrated circuit output pads, the integrated circuit output pads including an alarm integrated circuit output pad and a test mode integrated circuit output pad, comprising:
    a tamper detection circuit operable to generate a tamper alarm signal; and
    first circuitry coupled to receive the tamper alarm signal from the tamper detection circuit and operable, responsive to a test mode signal indicative of whether the integrated circuit is operating in a test mode, to selectively couple the tamper alarm signal to one of the plurality of integrated circuit output pads depending on a logic state of said test mode signal;
    wherein the selective coupling is operable, when the test mode signal has a first logic state indicating that the integrated circuit is not operating in test mode, to couple the received tamper alarm signal for output from the integrated circuit at the alarm integrated circuit output pad; and
    wherein the selective coupling is further operable, when the test mode signal has a second logic state indicates that the integrated circuit is operating in test mode, to couple the received tamper alarm signal for output from the integrated circuit at the test mode integrated circuit output pad.

2. The circuit of claim 1 wherein the first circuitry is further operable, when the test mode signal has the first logic state indicating that the integrated circuit is not operating in test mode and the received tamper alarm signal is selectively coupled for output to the alarm integrated circuit output pad, to drive the test mode integrated circuit output pad to a known logic state.

3. The circuit of claim 1 wherein the first circuitry is further operable, when the test mode signal has the second logic state indicating that the integrated circuit is operating in test mode and the received tamper alarm signal is selectively coupled for output to the test mode integrated circuit output pad, to drive the alarm integrated circuit output pad to a known logic state.

4. The circuit of claim 1 wherein the first circuitry comprises a logic circuit operable to logically combine the received tamper alarm signal with at least one other tamper alarm signal.

5. The circuit of claim 1, further comprising:
    a first multi-bit register which is programmable to store a programmable tamper detection threshold;
    wherein the tamper detection circuit is operable to receive said tamper detection threshold and generate said tamper alarm signal in response to said tamper detection threshold.

6. The circuit of claim 5, wherein the plurality of integrated circuit output pads further includes a serial data integrated circuit output pad, further comprising:
    second circuitry operable to convert the tamper detection threshold received from the first multi-bit register to a serial data output signal and selectively couple the serial data output signal for output from the integrated circuit at the serial data integrated circuit output pad when the test mode signal has the second logic state indicating that the integrated circuit is operating in test mode.

7. The circuit of claim 6, wherein the second circuitry is further operable, when the test mode signal has the first logic state indicating that the integrated circuit is not operating in test mode, to drive the serial data integrated circuit output pad to a known logic state.

8. The circuit of claim 6, further comprising:
    a second multi-bit register which is programmable to store integrated circuit data;
    a multiplexer having inputs coupled to the first and second multi-bit registers and an output coupled to the second circuitry, said multiplexer operable to select one of the tamper detection threshold and integrated circuit data for input to the second circuitry,
    wherein, if the integrated circuit data is selected, the second circuitry is operable to convert the integrated circuit data received from the second multi-bit register to the serial data output signal and selectively couple the serial data output signal for output from the integrated circuit at the serial data integrated circuit output pad when the test mode signal has the second logic state indicating that the integrated circuit is operating in test mode.

9. The circuit of claim 1, wherein the plurality of integrated circuit output pads further includes a serial data integrated circuit output pad, further comprising:
 a multi-bit register which is programmable to store integrated circuit data; and
 second circuitry operable to convert the integrated circuit data received from the second multi-bit register to a serial data output signal and selectively couple the serial data output signal for output from the integrated circuit at the serial data integrated circuit output pad when the test mode signal has the second logic state indicating that the integrated circuit is operating in test mode.

10. The circuit of claim 9, wherein the second circuitry is further operable, when the test mode signal has the first logic state indicating that the integrated circuit is not operating in test mode, to drive the serial data integrated circuit output pad to a known logic state.

11. An integrated circuit including a plurality of integrated circuit output pads, the integrated circuit output pads including an alarm integrated circuit output pad and a test mode integrated circuit output pad, comprising:
 a tamper detection circuit operable to generate a tamper alarm signal; and
 first circuitry coupled to receive the tamper alarm signal from the tamper detection circuit and operable, responsive to a test mode signal indicative of whether the integrated circuit is operating in a test mode, to selectively couple the tamper alarm signal to one of the plurality of integrated circuit output pads depending on a logic state of said test mode signal;
 wherein the selective coupling is operable, when the test mode signal has a first logic state indicating that the integrated circuit is not operating in test mode, to couple the received tamper alarm signal for output from the integrated circuit at the alarm integrated circuit output pad;
 wherein the selective coupling is further operable, when the test mode signal has a second logic state indicates that the integrated circuit is operating in test mode, to couple the received tamper alarm signal for output from the integrated circuit at the test mode integrated circuit output pad; and
 said first circuitry comprising a logic circuit operable to selectively logically combine the tamper alarm signal with at least one other alarm signal based on a logic state of one or more corresponding enable signals.

12. The circuit of claim 11, wherein the first circuitry is further operable, when the test mode signal has the first logic state indicating that the integrated circuit is not operating in test mode and the received tamper alarm signal is selectively coupled for output to the alarm integrated circuit output pad, to drive at least one of the test mode integrated circuit output pad and the alarm integrated circuit output pad to a known logic state.

13. The circuit of claim 11, wherein the plurality of integrated circuit output pads further includes a serial data integrated circuit output pad, further comprising:
 second circuitry operable to convert a tamper detection threshold to a serial data output signal and selectively couple the serial data output signal for output from the integrated circuit at the serial data integrated circuit output pad when the test mode signal has the second logic state indicating that the integrated circuit is operating in test mode.

14. The circuit of claim 13, further comprising:
 a multiplexer having operable to select one of the tamper detection threshold and integrated circuit data for input to the second circuitry,
 wherein, if the integrated circuit data is selected, the second circuitry is operable to convert the integrated circuit data to the serial data output signal and selectively couple the serial data output signal for output from the integrated circuit at the serial data integrated circuit output pad when the test mode signal has the second logic state indicating that the integrated circuit is operating in test mode.

15. An integrated circuit including a plurality of integrated circuit output pads, the integrated circuit output pads including a serial data integrated circuit output pad, comprising:
 a first multi-bit register which is programmable to store a programmable threshold value;
 a second multi-bit register which is programmable to store integrated circuit data;
 a multiplexer having inputs coupled to the first and second multi-bit registers and an output, said multiplexer operable to selectively pass one of the threshold value and integrated circuit data to said output as parallel output data; and
 first circuitry coupled to the output of the multiplexer and operable coupling the first multi-bit register to the output pad, the first circuitry operable to convert the parallel output data received from the multiplexer output to a serial data output signal and selectively couple the serial data output signal for output from the integrated circuit at the serial data integrated circuit output pad when a test mode signal for the integrated circuit has a first logic state indicating that the integrated circuit is operating in test mode.

16. The circuit of claim 15, wherein the first circuitry is further operable, when the test mode signal has a second logic state indicating that the integrated circuit is not operating in test mode, to drive the serial data integrated circuit output pad to a known logic state.

17. The circuit of claim 15, wherein the programmable threshold value is value used by a tamper detection circuit to detect an instance of tampering with the integrated circuit.

18. The circuit of claim 17, wherein the integrated circuit output pads further include an alarm integrated circuit output pad and a test mode integrated circuit output pad, and wherein the tamper detection circuit is operable, responsive to a detected instance of tampering with the integrated circuit, to generate a tamper alarm signal, further comprising:
 second circuitry coupled to receive the tamper alarm signal from the tamper detection circuit and operable, responsive to a test mode signal indicative of whether the integrated circuit is operating in a test mode, to selectively couple the tamper alarm signal to one of the plurality of integrated circuit output pads depending on a logic state of said test mode signal;
 wherein the selective coupling is operable, to couple the received tamper alarm signal for output from the integrated circuit at the alarm integrated circuit output pad when the test mode signal has a second logic state indicating that the integrated circuit is not operating in test mode; and
 wherein the selective coupling is further operable, to couple the received tamper alarm signal for output from the integrated circuit at the test mode integrated circuit output pad when the test mode signal has the first logic state indicating that the integrated circuit is operating in test mode.

19. The circuit of claim 18 wherein the second circuitry is further operable, when the test mode signal has the first logic state indicating that the integrated circuit is not operating in test mode and the received tamper alarm signal is selectively coupled for output to the alarm integrated circuit output pad, to drive the test mode integrated circuit output pad to a known logic state.

20. The circuit of claim 18 wherein the second circuitry is further operable, when the test mode signal has the second logic state indicating that the integrated circuit is operating in test mode and the received tamper alarm signal is selectively coupled for output to the test mode integrated circuit output pad, to drive the alarm integrated circuit output pad to a known logic state.

* * * * *